US012749543B2

(12) United States Patent
Hu et al.

(10) Patent No.: US 12,749,543 B2
(45) Date of Patent: Sep. 29, 2026

(54) VOLTAGE ADJUSTMENT METHOD, MEMORY STORAGE DEVICE, AND MEMORY CONTROL CIRCUIT UNIT

(71) Applicant: Hefei Core Storage Electronic Limited, Anhui (CN)

(72) Inventors: Jian Hu, Anhui (CN); Wan-Jun Hong, Anhui (CN); Tsung-Lin Wu, Hsinchu City (TW); Qi-Ao Zhu, Anhui (CN); Chong Peng, Anhui (CN)

(73) Assignee: Hefei Core Storage Electronic Limited, Anhui (CN)

( * ) Notice: Subject to any disclaimer, the term of this patent is extended or adjusted under 35 U.S.C. 154(b) by 153 days.

(21) Appl. No.: 18/813,002

(22) Filed: Aug. 22, 2024

(65) Prior Publication Data

US 2025/0239310 A1 Jul. 24, 2025

(30) Foreign Application Priority Data

Jan. 23, 2024 (CN) ........................ 202410090932.3

(51) Int. Cl.
*G11C 7/22* (2006.01)
*G11C 16/26* (2006.01)
*G11C 16/34* (2006.01)

(52) U.S. Cl.
CPC .......... *G11C 16/26* (2013.01); *G11C 16/3404* (2013.01)

(58) Field of Classification Search
CPC . G11C 16/26; G11C 16/3404; G11C 11/5642; G11C 16/0483; Y02D 10/00; G06F 3/061; G06F 3/0638; G06F 3/0658; G06F 3/0679
USPC .................................................. 365/189.011
See application file for complete search history.

(56) References Cited

U.S. PATENT DOCUMENTS

| | | | | |
|---|---|---|---|---|
| 9,741,431 | B2 * | 8/2017 | Kumar | G11C 29/021 |
| 10,783,973 | B1 * | 9/2020 | Lien | G06F 11/1048 |
| 11,221,791 | B2 * | 1/2022 | Zhu | G06F 3/061 |
| 11,244,732 | B2 * | 2/2022 | Sharon | G06F 11/3058 |
| 11,295,819 | B2 * | 4/2022 | Goode | G11C 16/0483 |

(Continued)

FOREIGN PATENT DOCUMENTS

| | | |
|---|---|---|
| CN | 101740122 | 6/2010 |
| CN | 108428467 | 8/2018 |

(Continued)

OTHER PUBLICATIONS

"Office Action of Taiwan Counterpart Application", issued on Feb. 21, 2025, p. 1-p. 7.

*Primary Examiner* — Tha-O H Bui
(74) *Attorney, Agent, or Firm* — JCIPRNET

(57) ABSTRACT

Voltage adjustment method, which may be implemented by a memory storage device and a memory control circuit unit, includes: reading a first physical unit among the physical units based on a first read voltage to obtain a first count value, wherein the first count value reflects a total number of memory cells each having a threshold voltage lower than the first read voltage; obtaining a second count value based on a difference between the first count value and a first default value; bringing the second count value into a target formula to obtain a voltage adjustment parameter; adjusting the first read voltage to a second read voltage according to the voltage adjustment parameter; and reading the first physical unit based on the second read voltage.

18 Claims, 6 Drawing Sheets

(56) References Cited

U.S. PATENT DOCUMENTS

| | | | |
|---|---|---|---|
| 2017/0039003 | A1 | 2/2017 | Hara |
| 2021/0064284 | A1 | 3/2021 | Kuo |
| 2023/0176741 | A1 | 6/2023 | McNeil et al. |
| 2023/0214150 | A1 | 7/2023 | Zeng et al. |

FOREIGN PATENT DOCUMENTS

| | | |
|---|---|---|
| CN | 114360612 | 4/2022 |
| CN | 116434808 | 7/2023 |
| JP | 2021149995 | 9/2021 |
| TW | I649754 | 2/2019 |
| TW | I768496 | 6/2022 |

* cited by examiner

VOLTAGE ADJUSTMENT METHOD, MEMORY STORAGE DEVICE, AND MEMORY CONTROL CIRCUIT UNIT

CROSS-REFERENCE TO RELATED APPLICATION

This application claims the priority benefit of China application serial no. 202410090932.3, filed on Jan. 23, 2024. The entirety of the above-mentioned patent application is hereby incorporated by reference herein and made a part of this specification.

BACKGROUND

Technical Field

The present invention relates to a memory control technology, and in particular, to a voltage adjustment method, a memory storage device and a memory control circuit unit.

Description of Related Art

Portable electronic devices such as mobile phones and notebook computers have grown rapidly in recent years, resulting in a rapid increase in consumer demand for storage media. Since rewritable non-volatile memory module (for example, flash memory) has the characteristics of data non-volatile, power saving, small size, and no mechanical structure, the rewritable non-volatile memory module is very suitable to be built into the various portable electronic devices exemplarily mentioned above.

Traditionally, if there are too many errors in the data read from a physical page in a rewritable non-volatile memory module, these errors may not be completely corrected in subsequent decoding operations. In this case, a general operation is to adjust a read voltage by querying a large number of data tables, and use the adjusted read voltage to re-read data from the same physical page and then decode the data to try to reduce the number of error bits in the read data, so as to improve a decoding success rate. However, in practice, due to the large number of data tables need to be queried, it often takes a lot of time to adjust the read voltage to a suitable voltage position, thus reducing data read efficiency.

SUMMARY

The disclosure provides a memory management method, a memory storage device, and a memory control circuit unit, which may improve the data read efficiency.

Exemplary embodiments of the disclosure provides a voltage adjustment method for a rewritable non-volatile memory module, wherein the rewritable non-volatile memory module comprises a plurality of physical units, and the voltage adjustment method comprises: reading a first physical unit among the physical units based on a first read voltage to obtain a first count value, wherein the first count value reflects a total number of memory cells each having a threshold voltage lower than the first read voltage; obtaining a second count value based on a difference between the first count value and a first default value; bringing the second count value into a formula below to obtain a voltage adjustment parameter, $$\Delta R = (|\Delta CNT1|)/((|\Delta CNT1|)/a + b)$$

wherein ΔR represents the voltage adjustment parameter, ΔCNT1 represents the second count value, and a and b are constants; adjusting the first read voltage to a second read voltage according to the voltage adjustment parameter; and reading the first physical unit based on the second read voltage.

Exemplary embodiments of the disclosure further provides a memory storage device, comprising: a connection interface unit, configured to connect to a host system; a rewritable non-volatile memory module, comprising a plurality of physical units; and a memory control circuit unit, connected to the connection interface unit and the rewritable non-volatile memory module, wherein the memory control circuit unit is configured to: read a first physical unit among the physical units based on a first read voltage to obtain a first count value, wherein the first count value reflects a total number of memory cells each having a threshold voltage lower than the first read voltage; obtain a second count value based on a difference between the first count value and a first default value; bring the second count value into a formula below to obtain a voltage adjustment parameter, $$\Delta R = (|\Delta CNT1|)/((|\Delta CNT1|)/a + b)$$

wherein ΔR represents the voltage adjustment parameter, ΔCNT1 represents the second count value, and a and b are constants; adjust the first read voltage to a second read voltage according to the voltage adjustment parameter; and read the first physical unit based on the second read voltage.

Exemplary embodiments of the disclosure further provides a memory control circuit unit for controlling a rewritable non-volatile memory module, wherein the rewritable non-volatile memory module comprises a plurality of physical units, and the memory control circuit unit comprises: a host interface, configured to connect to a host system; a memory interface, configured to connect to the rewriteable non-volatile memory module; and a memory management circuit, connected to the host interface and the memory interface, wherein the memory management circuit is configured to: read a first physical unit among the physical units based on a first read voltage to obtain a first count value, wherein the first count value reflects a total number of memory cells each having a threshold voltage lower than the first read voltage; obtain a second count value based on a difference between the first count value and a first default value; bring the second count value into a formula below to obtain a voltage adjustment parameter, $$\Delta R = (|\Delta CNT1|)/((|\Delta CNT1|)/a + b)$$

wherein ΔR represents the voltage adjustment parameter, ΔCNT1 represents the second count value, and a and b are constants; adjust the first read voltage to a second read voltage according to the voltage adjustment parameter; and read the first physical unit based on the second read voltage.

Based on the above, after reading the first physical unit based on the first read voltage, the first count value may be obtained. The first count value may reflect the total number of memory cells each having the threshold voltage lower than the first read voltage in the first physical unit. Based on the difference between the first count value and the first default value, the second count value may be obtained. After bringing the second count value into a target formula, the voltage adjustment parameter may be obtained, and then the first read voltage may be adjusted to the second read voltage according to the voltage adjustment parameter. Afterwards, the first physical unit may be re-read based on the second read voltage to improve the accuracy of the read data and thus improve data read efficiency

DETAILED DESCRIPTION OF DISCLOSED EMBODIMENTS

Figure 1:
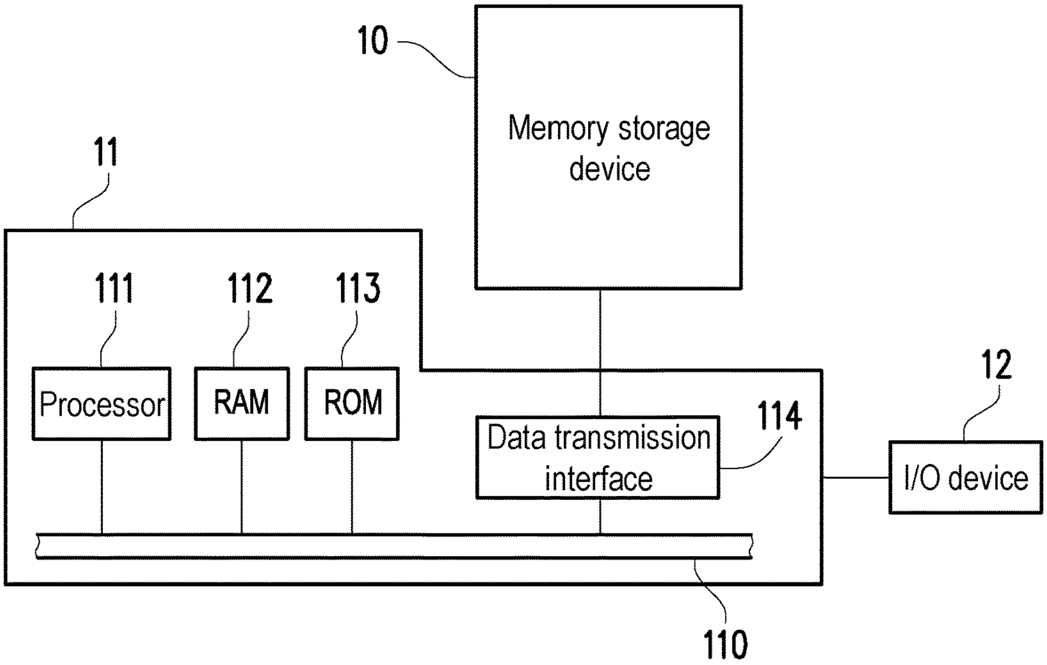
FIG. 1 (PRIOR ART)
FIG. 1 is a schematic diagram of a host system, a memory storage device, and an input/output (I/O) device according to an exemplary embodiment of the present invention.
Figure 2:
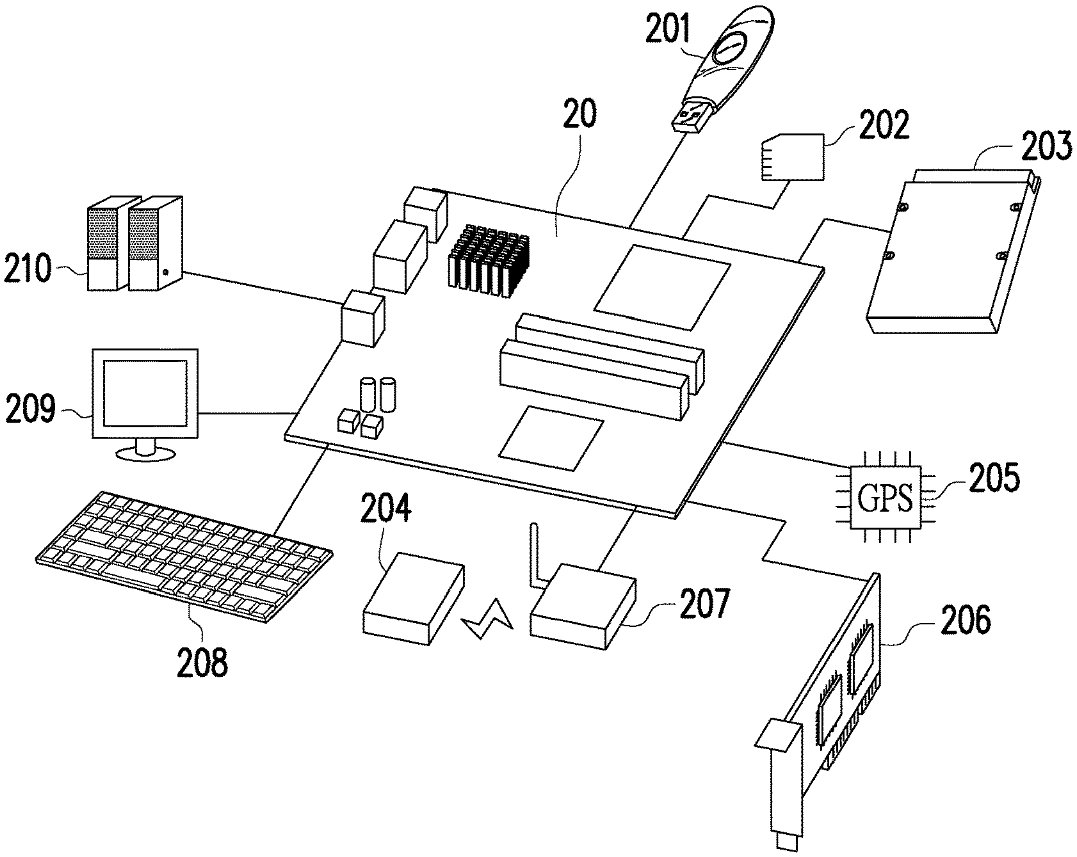
FIG. 2 (PRIOR ART)
FIG. 2 is a schematic diagram of a host system, a memory storage device and an I/O device according to an exemplary embodiment of the present invention.

FIG. 1 is a schematic diagram of a host system, a memory storage device, and an input/output (I/O) device according to an exemplary embodiment of the present disclosure. FIG. 2 is a schematic diagram of a host system, a memory storage device, and an I/O device according to an exemplary embodiment of the present disclosure.

Referring to FIGS. 1 and 2, the host system 11 may include a processor 111, a random access memory (RAM) 112, a read only memory (ROM) 113, and a data transmission interface 114. The processor 111, the random access memory 112, the read only memory 113 and the data transmission interface 114 may be connected to a system bus 110.

The host system 11 may be connected to the memory storage device 10 through the data transmission interface 114. For example, the host system 11 may store data to the memory storage device 10 or read data from the memory storage device 10 through the data transmission interface 114. In addition, the host system 11 may be connected to the I/O device 12 through the system bus 110. For example, the host system 11 may transmit output signals to the I/O device 12 or receive input signals from the I/O device 12 through the system bus 110.

In an exemplary embodiment, the processor 111, the random access memory 112, the read only memory 113 and the data transmission interface 114 may be disposed on a motherboard 20 of the host system 11. The number of the data transmission interfaces 114 may be one or more. Through the data transmission interface 114, the motherboard 20 may be connected to the memory storage device 10 through wired or wireless means.

In an exemplary embodiment, the memory storage device 10 may be, for example, a pen drive 201, a memory card 202, a solid state drive (SSD) 203 or a wireless memory storage device 204. The wireless memory storage device 204 may be, for example, a Near Field Communication (NFC) memory storage device, a WiFi memory storage device, a Bluetooth memory storage device, a low-power Bluetooth memory storage device (e.g., iBeacon) or other types of memory storage devices based on various wireless communication technologies. In addition, the motherboard 20 may also be connected to different I/O devices, such as a Global Positioning System (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

In an exemplary embodiment, the host system 11 is a computer system. In an example embodiment, the host system 11 may be any system that may substantially cooperate with a memory storage device for storing data. In an example embodiment, the memory storage device 10 and the host system 11 may respectively include the memory storage device 30 and the host system 31 of FIG. 3.

Figure 3:
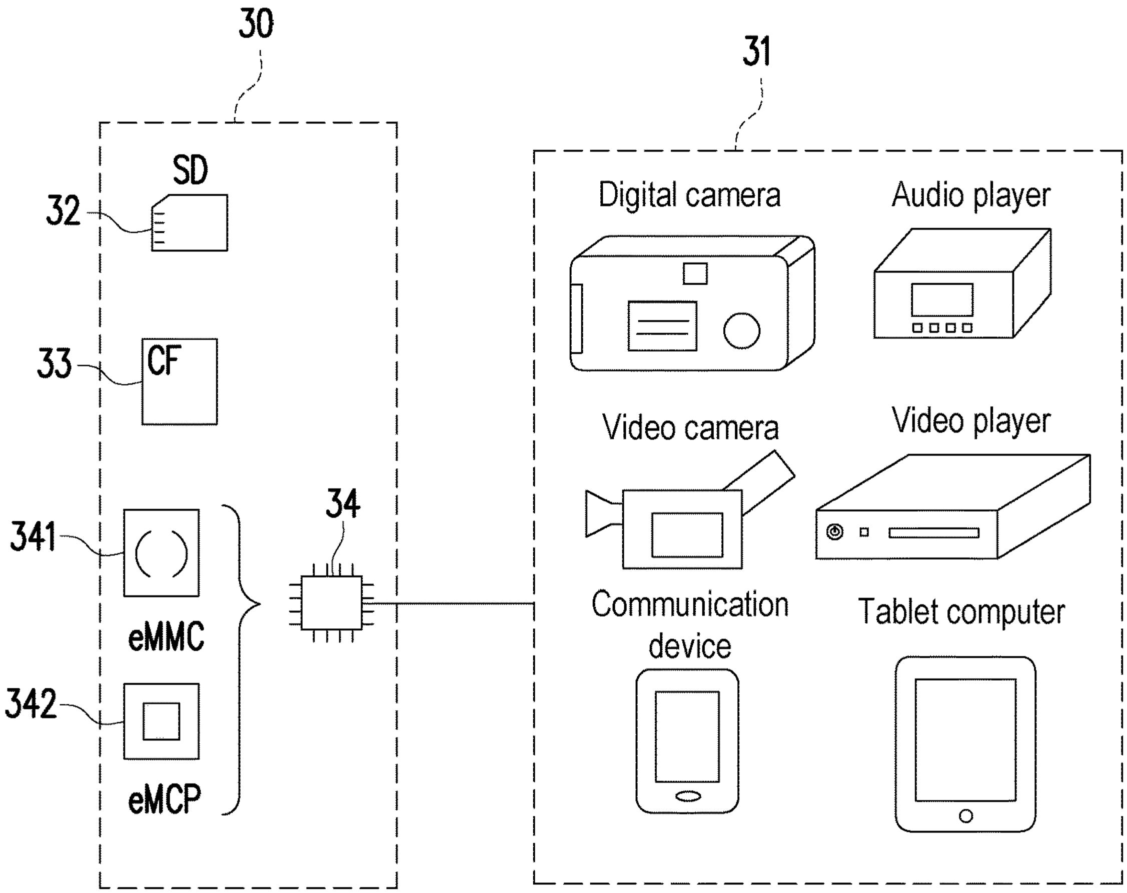
FIG. 3 (PRIOR ART)
FIG. 3 is a schematic diagram of a host system and a memory storage device according to an exemplary embodiment of the present invention.

FIG. 3 is a schematic diagram of a host system and a memory storage device according to an exemplary embodiment of the present disclosure. Referring to FIG. 3, the memory storage device 30 may be operated with the host system 31 for storing data. For example, the host system 31 may be a system, such as a digital camera, a video camera, a communication device, an audio player, a video player or a tablet computer. For example, the memory storage device 30 may be various non-volatile memory storage devices, such as a Secure Digital (SD) card 32, a Compact Flash (CF) card 33 or an embedded storage device 34, used by the host system 31. The embedded storage device 34 includes various types of embedded storage devices, such as an embedded Multi Media Card (eMMC) 341 and/or an embedded Multi Chip Package (eMCP) storage device 342, which directly connects a memory module to the motherboard 20 of the host system 31.

Figure 4:
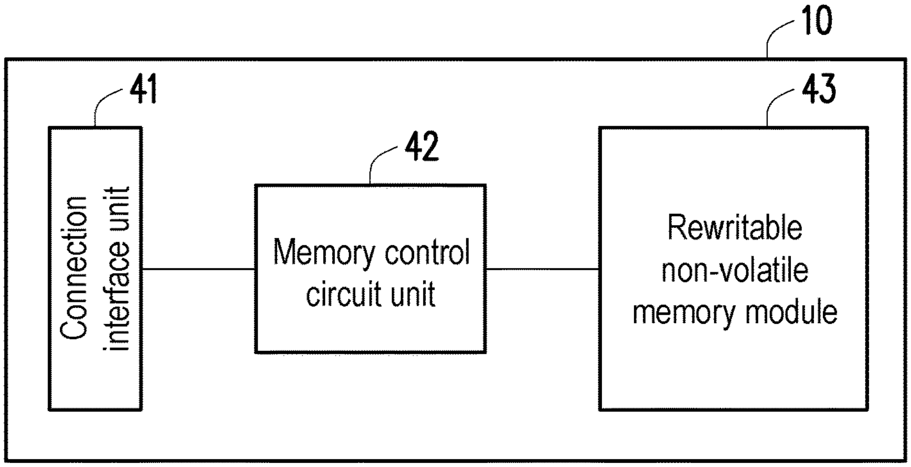
FIG. 4 (PRIOR ART)
FIG. 4 is a schematic diagram of a memory storage device according to an exemplary embodiment of the present invention.

FIG. 4 is a schematic diagram of a memory storage device according to an exemplary embodiment of the present disclosure. Referring to FIG. 4, the memory storage device 10 includes a connection interface unit 41, a memory control circuit unit 42 and a rewritable non-volatile memory module 43.

The connection interface unit 41 is configured to connect to the host system 11. The memory storage device 10 may communicate with the host system 11 through the connection interface unit 41. For example, the connection interface unit 41 may be compatible with a Peripheral Component Interconnect Express (PCI Express) standard, a Serial Advanced Technology Attachment (SATA) standard, a Parallel Advanced Technology Attachment (PATA) standard, an Institute of Electrical and Electronic Engineers (IEEE) 1394 standard, an Universal Serial Bus (USB) standard, a SD interface standard, an Ultra High Speed-I (UHS-I)) interface standard, an Ultra High Speed-II (UHS-II) interface standard, a Memory Stick (MS) interface standard, a MCP interface standard, a MMC interface standard, an eMMC interface standard, an Universal Flash Storage (UFS) interface standard, an eMCP interface standard, a CF interface standard, an Integrated Device Electronics (IDE) standard or other suitable standards.

The memory control circuit unit 42 is connected to the connection interface unit 41 and the rewritable non-volatile memory module 43. The memory control circuit unit 42 is configured to control the rewritable non-volatile memory module 43. For example, the memory control circuit unit 42 may instruct the rewritable non-volatile memory module 43 to perform operations such as writing, reading, and erasing data according to instructions from the host system 11. For example, memory control circuit unit 42 may include a flash memory controller.

The rewritable non-volatile memory module 43 is configured to store data from the host system 11. The rewritable non-volatile memory module 43 may include a Single Level Cell (SLC) NAND flash memory module (that is, a flash memory module that may store 1 bit in one memory cell), Multi Level Cell (MLC) NAND flash memory module (that is, a flash memory module that may store 2 bits in one memory cell), Triple Level Cell (TLC) NAND flash memory module (that is, a flash memory module that may store 3 bits in one memory cell), Quad Level Cell (QLC) NAND flash memory module group (that is, a flash memory module that may store 4 bits in a memory cell), other flash memory modules, or other memory modules with the same or similar characteristics.

Figure 5:
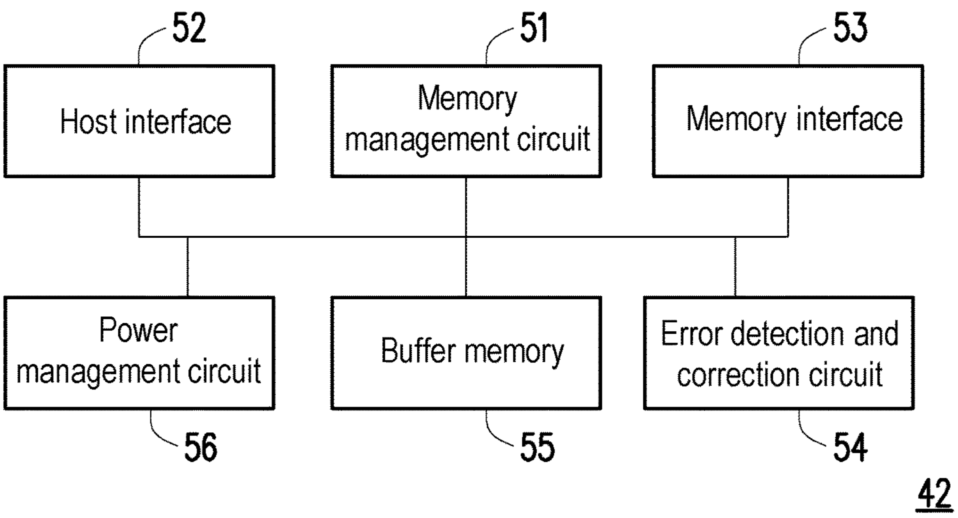
FIG. 5 (PRIOR ART)
FIG. 5 is a schematic diagram of a memory control circuit unit according to an exemplary embodiment of the present invention.

FIG. 5 is a schematic diagram of a memory control circuit unit according to an exemplary embodiment of the present disclosure. Referring to FIG. 5, the memory control circuit unit 42 includes a memory management circuit 51, a host interface 52 and a memory interface 53.

The memory management circuit 51 is configured to control the overall operation of the memory control circuit unit 42. For example, the memory management circuit 51 may include a Central Processing Unit (CPU), or other programmable general-purpose or special-purpose microprocessor, a Digital Signal Processor (DSP), a programmable controller, an Application Specific Integrated Circuits (ASIC), a Programmable Logic Device (PLD) or other similar devices or a combination of these devices.

The host interface 52 is connected to the memory management circuit 51. The memory management circuit 51 may communicate with the host system 11 through the host interface 52. For example, host interface 52 is compatible with the PCI Express standard, the SATA standard, the PATA standard, the IEEE 1394 standard, the USB standard, the SD standard, the UHS-I standard, the UHS-II standard, the MS standard, the MMC standard, the eMMC standard, the UFS standard, the CF standard, the IDE standard or other suitable data transmission standards.

The memory interface 53 is connected to memory management circuit 51. The memory management circuit 51 may access the rewritable non-volatile memory module 43 through the memory interface 53. For example, the memory management circuit 51 may issue operation instructions to the rewritable non-volatile memory module 43 through the memory interface 53 to instruct the rewritable non-volatile memory module 43 to perform various operations such as reading, writing, or erasing data.

In an exemplary embodiment, the memory control circuit unit 42 further includes an error detection and correction circuit 54, a buffer memory 55 and a power management circuit 56.

The error detection and correction circuit 54 is connected to the memory management circuit 51 and is configured to perform error detection and correction operation to ensure the correctness of data. For example, when the memory management circuit 51 receives a write instruction from the host system 11, the error detection and correction circuit 54 may generate an error correction code (ECC) and/or an error detection code (EDC) for the data corresponding to the write command, and the memory management circuit 51 may store the data corresponding to the write instruction and the corresponding error correction code and/or error detection code into the rewritable non-volatile memory module 43. Afterwards, when the memory management circuit 51 reads data from the rewritable non-volatile memory module 43, the memory management circuit 51 also reads the error correction code and/or the error check code corresponding to the data, and the error detection and correction circuit 54 may perform the error detection and correction operation on the read data according to the error correction code and/or the error check code.

The buffer memory 55 is connected to the memory management circuit 51 and is configured to temporarily store data. The power management circuit 56 is connected to the memory management circuit 51 and is configured to control the power supply of the memory storage device 10.

Figure 6:
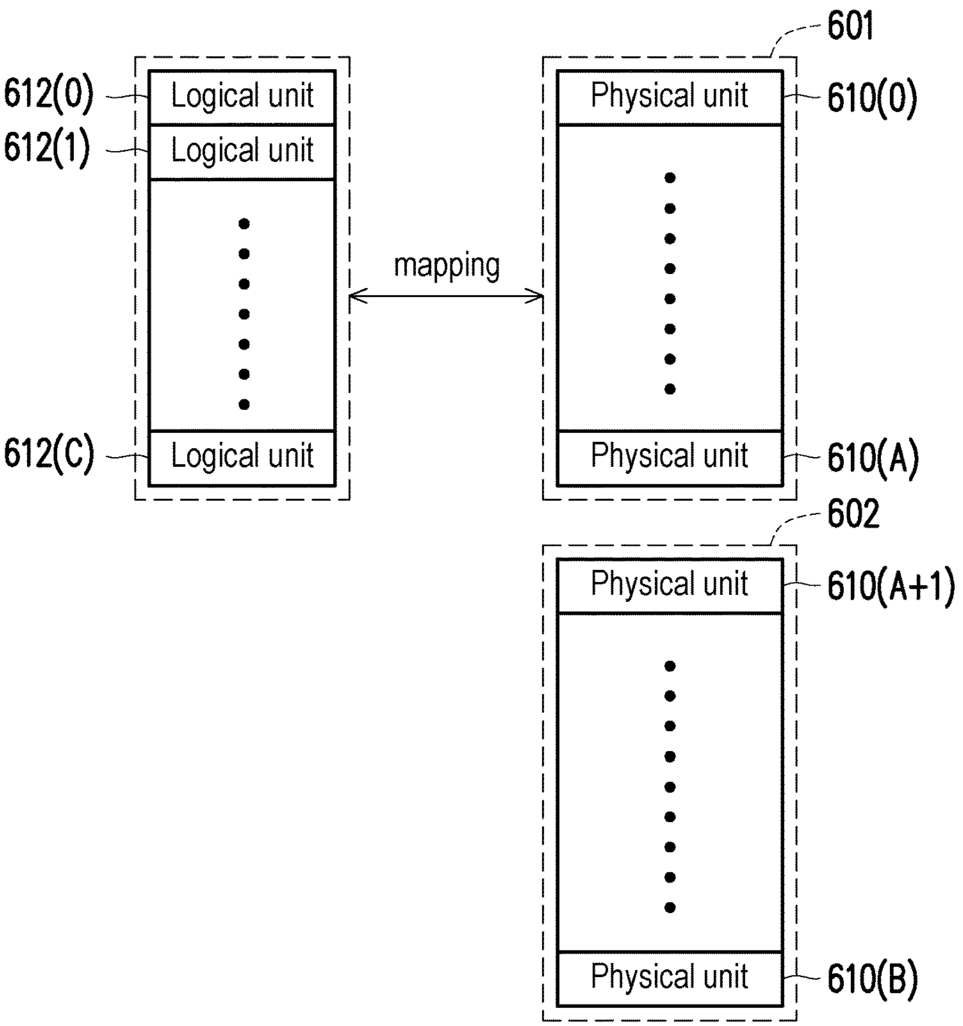
FIG. 6 (PRIOR ART)
FIG. 6 is a schematic diagram of managing a rewritable non-volatile memory module according to an exemplary embodiment of the present invention.

FIG. 6 is a schematic diagram of managing a rewritable non-volatile memory module according to an exemplary embodiment of the present disclosure. Referring to FIG. 6, the memory management circuit 51 may logically group the physical units 610(0) to 610(B) in the rewritable non-volatile memory module 43 into a storage area 601 and a spare area 602.

In an exemplary embodiment, a physical unit refers to a physical address or a physical programming unit. The physical programming unit is a basic unit for performing programming operation for storing data. For example, a physical programming unit may include one or more physical pages or physical sectors. In an example embodiment, a physical unit may also be composed of multiple consecutive or non-consecutive physical addresses. In an example embodiment, a physical unit may also refer to a virtual block (VB). A virtual block may include multiple physical addresses or multiple physical programming units. In an example embodiment, a virtual block may include one or more physical erasing units. The physical erasing unit is a basic unit for performing erasing operation for erasing data. For example, a physical erasing unit may include one or more physical blocks.

In an exemplary embodiment, the physical units 610(0) to 610(A) in the storage area 601 are configured to store user data (e.g., user data from the host system 11 in FIG. 1). For example, the physical units 610(0) to 610(A) in the storage area 601 may store valid data and invalid data. The physical units 610(A+1) to 610(B) in the spare area 602 do not store data (e.g., valid data). For example, if a certain physical unit does not store valid data, this physical unit may be associated (or added) to the spare area 602. In addition, the physical units in the spare area 602 (or the physical unit that does not store valid data) may be erased. As new data is to be stored, one or more physical units may be selected from the spare area 602 for storing the new data. In an example embodiment, the spare area 602 is also referred to as a free pool.

In an example embodiment, the memory management circuit 51 may configure logical units 612(0) to 612(C) to map the physical units 610(0) to 610(A) in the storage area 601. In an example embodiment, each logical unit corresponds to a logical address. For example, a logical address may include one or more Logical Block Address (LBA) or other logical management units. In an example embodiment, a logical unit may also correspond to a logical programming unit or be composed of multiple consecutive or non-consecutive logical addresses.

In an example embodiment, the memory management circuit 51 may record management data (also referred to as logical-to-physical mapping information) describing the mapping relationship between the logical unit and the physical unit in at least one logical-to-physical mapping table. When the host system 11 intends to read data from or write data to the memory storage device 10, the memory management circuit 51 may access the rewritable non-volatile memory module 43 according to the information recorded in the logical-to-physical mapping table.

Figure 7:
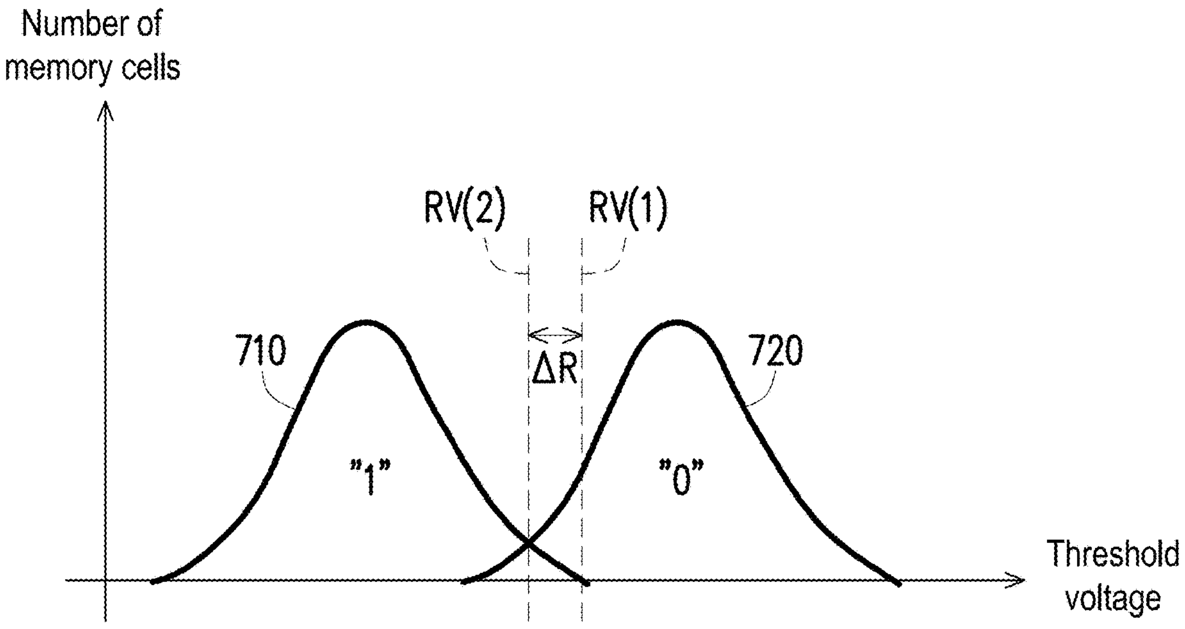
FIG. 7 is a schematic diagram of a threshold voltage distribution of memory cells according to an exemplary embodiment of the present invention.

FIG. 7 is a schematic diagram of a threshold voltage distribution of memory cells according to an exemplary embodiment of the present disclosure. Referring to FIG. 7, in an exemplary embodiment, after performing a programming operation on a certain physical unit (also referred to as a first physical unit) in the rewritable non-volatile memory module 43, a threshold voltage distribution of memory cells in the first physical unit may include states 710 and 720. The states 710 and 720 respectively correspond to different bits. For example, the state 710 corresponds to bit "1" and the state 720 corresponds to bit "0." That is, the memory cells belonging to state 710 may be regarded as storing bit "1", and the memory cells belonging to state 720 may be regarded as storing bit "0". However, in another example embodiment, the threshold voltage distribution of memory cells in the first physical unit may also include more states, and/or the bit (or bit combination) corresponding to each state may be adjusted according to practice, which is not limited by the present disclosure.

In an example embodiment, when data is read from the first physical unit, a read voltage RV(1) may be applied to the first physical unit, and the rewritable non-volatile memory module 43 may return a read result to memory management circuit 51. For example, after the read voltage RV(1) is applied to the first physical unit, if a threshold voltage of a memory cell in the first physical unit is lower than the read voltage RV(1), the rewritable non-volatile memory module 43 may return the bit "1" as the read result corresponding to this memory cell to the memory management circuit 51. Alternatively, if a threshold voltage of a memory cell in the first physical unit is higher than the read voltage RV(1), the rewritable non-volatile memory module 43 may return the bit "0" as the read result corresponding to this memory cell to the memory management circuit 51.

However, after the threshold voltage distribution of the memory cells in the first physical unit undergoes a serious voltage shift (as shown in FIG. 7), if the read voltage RV(1) not be corrected is continued to be used to read the first physical unit, then the data read from the first physical unit based on the read voltage RV(1) may contain a large number of errors (i.e., error bits), which causes the error detection and correction circuit 54 unable to successfully decode the data (i.e., unable to successfully correct all errors in the read data).

Taking FIG. 7 as an example, it is assumed that a certain memory cell in the first physical unit was originally configured to store bit "0". However, after the voltage offset occurs, the threshold voltage of this memory cell shifts to the left to be lower than the read voltage RV(1). In this case, if the uncorrected read voltage RV(1) is continuously used to read the memory cell, the memory management circuit 51 may read an error bit "1" from this memory cell (while bit "0" should be read actually). By analogy, as the voltage offsets of the memory cells in the first physical unit becomes more severe, the number of error bits read from the first physical unit may increase correspondingly, thereby increasing the difficulty of decoding.

In an exemplary embodiment, after a decoding failure occurs (that is, errors in the read data cannot be completely corrected), the memory management circuit 51 may initiate a re-reading operation of the first physical unit. In the reread operation, the memory management circuit 51 may adjust the read voltage for the next data read from the first physical unit to try to reduce the number of error bits in the data read from the first physical unit next time.

In an example embodiment, in the adjustment operation of the read voltage, the memory management circuit 51 may read the first physical unit based on a first read voltage to obtain a count value (also referred to as a first count value). The first count value may reflect a total number of memory cells each having a threshold voltage lower than the first read voltage in the first physical unit. Taking FIG. 7 as an example, assuming that the first read voltage is the read voltage RV(1), then the first count value may reflect the total number of memory cells in the first physical unit whose threshold voltage is lower than the read voltage RV(1). For example, assuming that the first count value is "6000", it means that the total number of memory cells whose threshold voltage is lower than the read voltage RV(1) in the current first physical unit is "6000".

In an example embodiment, the memory management circuit 51 may obtain another count value (also referred to as a second count value) based on the difference between the first count value and a default value (also referred to as a first default value). That is, the second count value may reflect the difference between the first count value and the first default value. For example, assuming that the difference between the first count value and the first default value is "2000", then the second count value may be "2000", and the present disclosure is not limited thereto.

In an example embodiment, the first default value may be positively related to the total number of all bits stored in the first physical unit. That is, the greater the total number of bits stored in the first physical unit, the greater the first default value may be. In an example embodiment, the first default value may be ½ of the total number of (all) bits stored in the first physical unit. For example, assuming that the total number of all bits stored in the first physical unit is "8000", then the first default value may be "4000" (that is, 8000/2=4000). In addition, assuming that the first count value is "6000", then the second count value may be "2000" (that is, 6000−4000=2000).

In an example embodiment, after obtaining the second count value, the memory management circuit 51 may bring the second count value into the following formula (also referred to as a target formula) to obtain a voltage adjustment parameter.

$$\Delta R = (|\Delta CNT1|)/((|\Delta CNT1|)/a + b)$$

In the target formula above, ΔR represents the voltage adjustment parameter, ΔCNT1 represents the second count value, and a and b are constants. It should be noted that, a and b may be set according to practical needs, and the present disclosure does not limit the actual values of a and b. In addition, the target formula may also be adjusted according to practical needs, which is not limited by the present disclosure.

In an example embodiment, the memory management circuit 51 may adjust the first read voltage to another read voltage (also referred to as a second read voltage) according to the voltage adjustment parameter (e.g., ΔR). The second read voltage may then be used in the reread operation of the first physical unit. For example, after obtaining the second read voltage, the memory management circuit 51 may read the first physical unit based on the second read voltage to try to reduce the number of error bits in the data read from the first physical unit in the reread operation.

In an example embodiment, the memory management circuit 51 may determine whether the second count value is greater than zero. In response to the second count value being greater than zero, the memory management circuit 51 may subtract the voltage adjustment parameter from the first read voltage to obtain the second read voltage. Taking FIG. 7 as an example, when the second count value is greater than zero (indicating that the first read voltage is shifted to the right direction), the memory management circuit 51 may subtract ΔR (i.e., the voltage adjustment parameter) from the read voltage RV(1) (i.e., the first read voltage) to obtain the read voltage RV(2) (i.e., the second read voltage) (i.e., RV(2)=RV(1)-ΔR). Alternatively, in response to the second count value being less than zero (indicating that the first read voltage is shifted to the left direction), the memory management circuit 51 may add the first read voltage to the voltage adjustment parameter to obtain the second read voltage.

Figure 8:
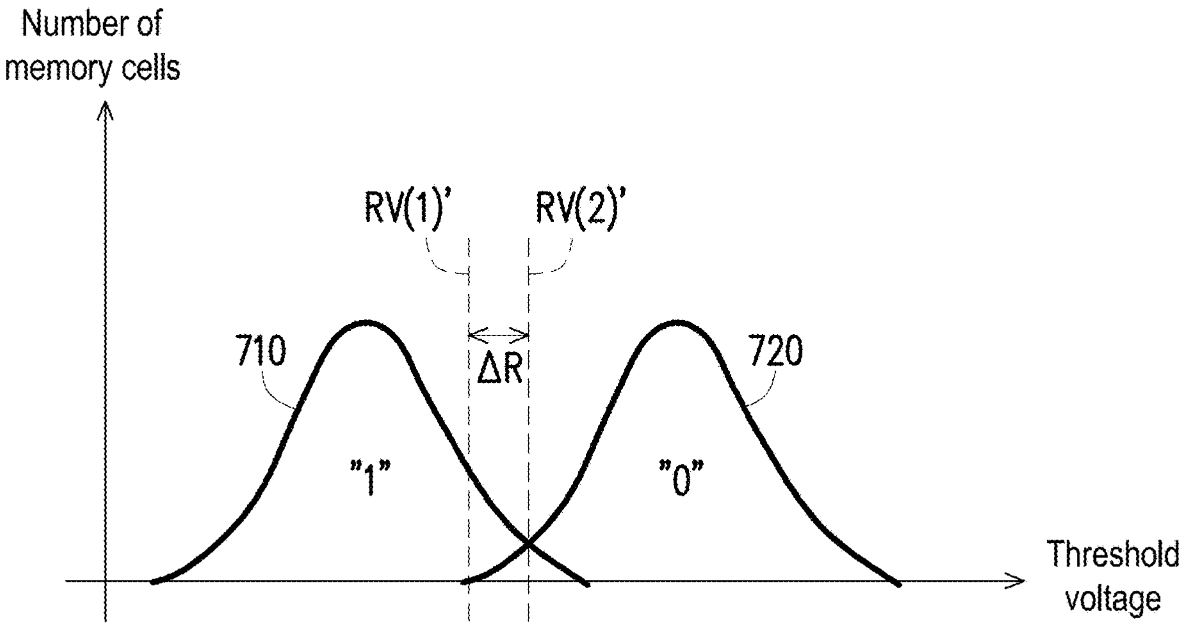
FIG. 8 is a schematic diagram of a threshold voltage distribution of memory cells according to an exemplary embodiment of the present invention.

FIG. 8 is a schematic diagram of a threshold voltage distribution of memory cells according to an exemplary embodiment of the present disclosure. Referring to FIG. 8, in an example embodiment, when the second count value is less than zero, the memory management circuit 51 may add the read voltage RV(1)' (i.e., the first read voltage) to ΔR (i.e., the voltage adjustment parameter) to obtain the read voltage RV(2)' (i.e., the second read voltage) (i.e., RV(2) '=RV(1)'+ΔR).

In an example embodiment, the memory management circuit 51 may use different parameter sets to set a and b in the target formula. For example, according to different second count values (such as different ΔCNT1), the memory management circuit 51 may select different parameter sets from multiple candidate parameter sets to set a and b in the target formula. As a result, ΔR (i.e., the voltage adjustment parameter) obtained through the target formula may be determined more accurately.

In an example embodiment, the memory management circuit 51 may determine whether the second count value (e.g., ΔCNT1) is greater than another default value (also referred to as a second default value). In response to the second count value being greater than the second default value, the memory management circuit 51 may use a first set of parameters to set a and b in the target formula. For example, in an exemplary embodiment, the memory management circuit 51 may use the first set of parameters to set a and b in the target formula as “62” and “46”, respectively. In addition, in response to the second count value not being greater than the second default value, the memory management circuit 51 may use a second set of parameters to set a and b in the target formula. The first set of parameters is different from the second set of parameters. For example, in an exemplary embodiment, the memory management circuit 51 may use the second set of parameters to set a and b in the target formula as “24” and “17”, respectively.

In an example embodiment, the second default value may also be positively related to the total number of all bits stored in the first physical unit, while the second default value is different from the first default value. For example, the second default value may be smaller than the first default value. In an example embodiment, the second default value may be 1/K of the total number of all bits stored in the first physical unit. For example, K may be 8 or other integers greater than 1, depending on practical needs.

Figure 9:
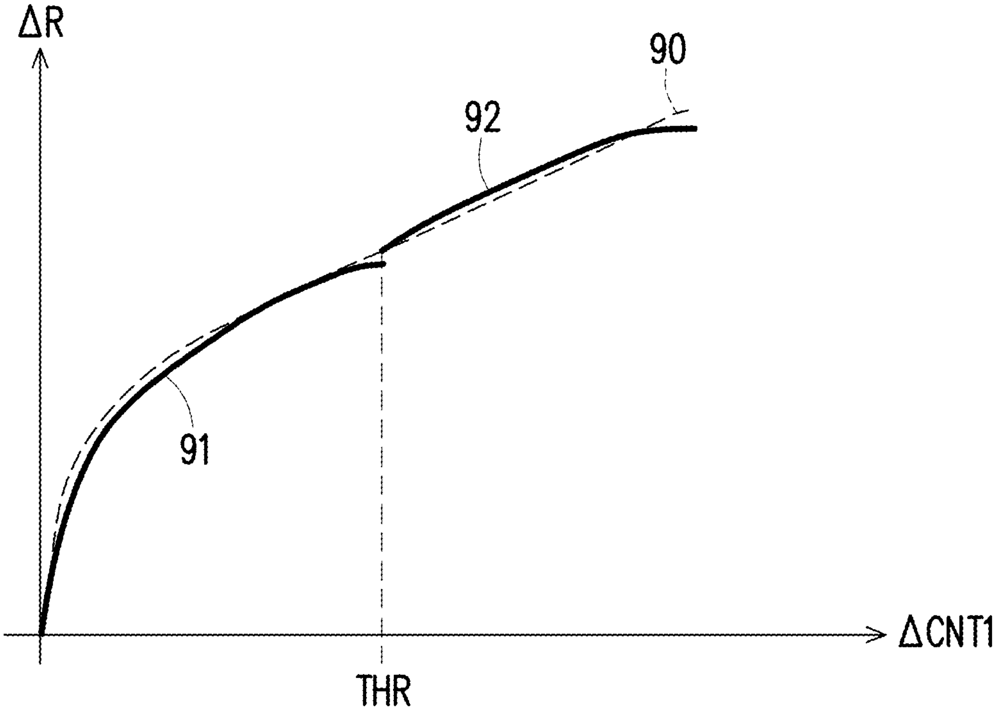
FIG. 9 is a schematic diagram of matching the correspondence relationship between the second count value and the voltage adjustment parameter by using multiple curves according to an exemplary embodiment of the present invention.

FIG. 9 is a schematic diagram of matching the correspondence relationship between the second count value and the voltage adjustment parameter by using multiple curves according to an exemplary embodiment of the present disclosure. Referring to FIG. 9, it is assumed that the curve 90 reflects the actual or optimal correspondence relationship between different second count values (i.e., ΔCNT1) and the voltage adjustment parameters (i.e., ΔR).

In an example embodiment, in a certain numerical interval (also referred to as a first numerical interval) of the second count value, the memory management circuit 51 may use a curve 91 to simulate a part of the curve 90. In addition, in another numerical interval (also referred to as a second numerical interval) of the second count value, the memory management circuit 51 may use a curve 92 to simulate another part of the curve 90. The first numerical interval and the second numerical interval do not overlap with each other.

In an example embodiment, it is assumed that a threshold value THR is the second default value. In a case where the second count value is less than the threshold value THR (that is, the second count value is located in the first numerical interval of the second count value), the memory management circuit 51 may use the curve 91 to match the curve 90. For example, if the first set of parameters is used to set a and b in the target formula (for example, a="24" and b="17"), then in a case that the second count value is less than the threshold value THR, the curve 91 may accurately match the actual or optimal correspondence relationship between the input (i.e., ΔCNT1) and the output (i.e., ΔR) of the target formula.

In an example embodiment, when the second count value is greater than the threshold value THR (that is, the second count value is located in the second numerical interval of the second count value), the memory management circuit 51 may use the curve 92 to match the curve 90. For example, if the second set of parameters is used to set a and b in the target formula (for example, a="62" and b="46"), then in a case that the second count value is greater than the threshold value THR, the curve 92 may accurately match the actual or optimal correspondence relationship between the input (i.e., ΔCNT1) and the output (i.e., ΔR) of the target formula. It should be noted that, in another exemplary embodiment, more or fewer curves may also be used to match the curve 90, which is not limited by the present disclosure.

Figure 10:
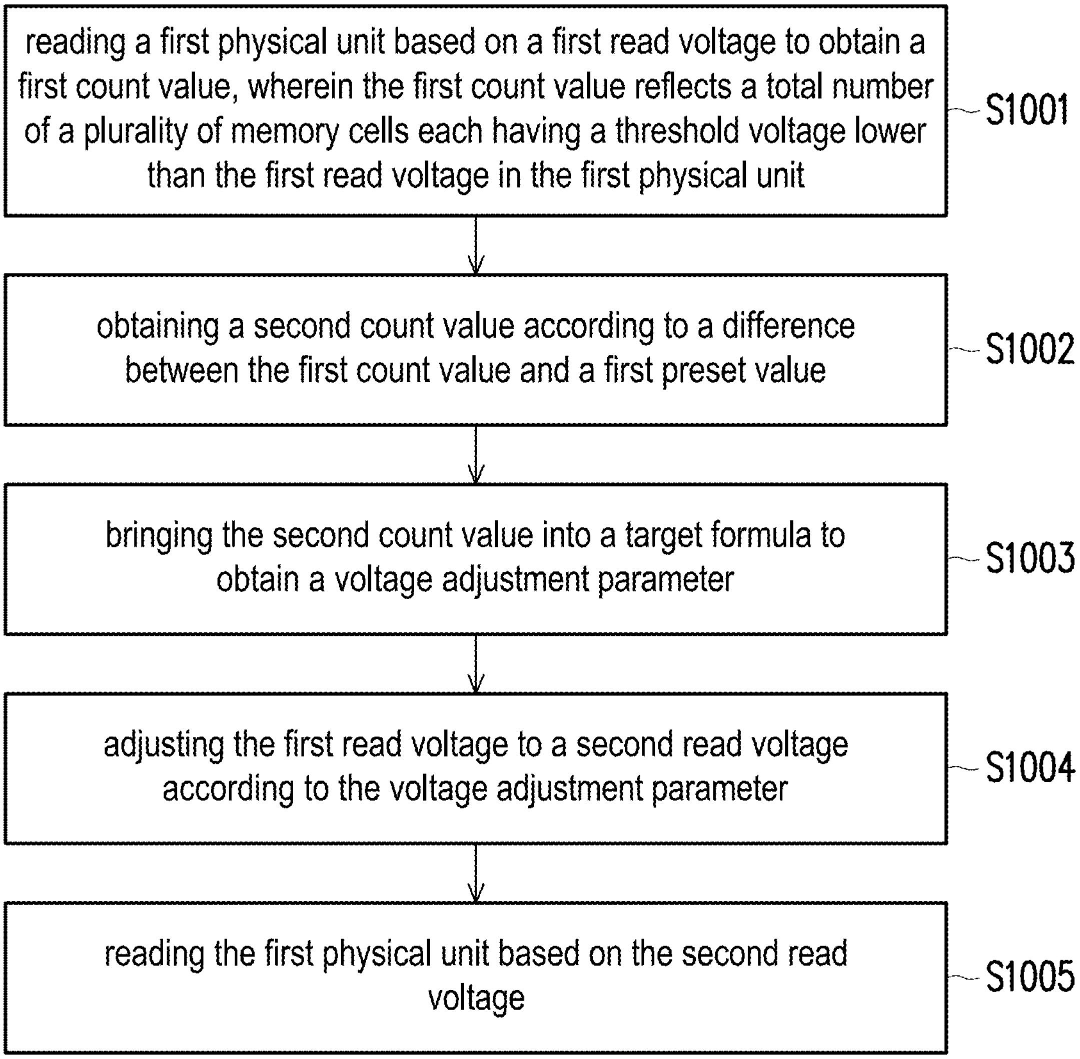
FIG. 10 is a flowchart of a voltage adjustment method according to an exemplary embodiment of the present invention.

FIG. 10 is a flowchart of a voltage adjustment method according to an exemplary embodiment of the present disclosure. Referring to FIG. 10, in step S1001, a first physical unit is read based on a first read voltage to obtain a first count value, wherein the first count value reflects a total number of memory cells each having a threshold voltage lower than the first read voltage in the first physical unit. In step S1002, a second count value is obtained according to the difference between the first count value and a first default value. In step S1003, the second count value is brought into a formula (i.e., the target formula) to obtain a voltage adjustment parameter. In step S1004, the first read voltage is adjusted to a second read voltage according to the voltage adjustment parameter. In step S1005, the first physical unit is read based on the second read voltage.

However, each step in FIG. 10 has been described in detail above and will not be described again here. It is noted that each step in FIG. 10 may be implemented as program codes or circuits, and the present disclosure is not limited thereto. In addition, the method of FIG. 10 may be used in conjunction with the above example embodiments or may be used alone, which is not limited by the present disclosure.

In summary, the voltage adjustment method, the memory storage device and the memory control circuit unit proposed by exemplary embodiment of the present disclosure may evaluate the shift of the read voltage through a specially designed means, and then use a corresponding voltage adjustment parameters to adjust the read voltage, so as to improve the data reading efficiency. In addition, by using segmented curves to match the actual or optimal correspondence relationship between the input and output of the target formula, the calculation accuracy of the voltage adjustment parameter may also be effectively improved.

Although the disclosure has been disclosed in the above embodiments, the embodiments are not intended to limit the disclosure. Persons skilled in the art may make some changes and modifications without departing from the spirit and scope of the disclosure. The protection scope of the disclosure shall be defined by the appended claims.

What is claimed is:

1. A voltage adjustment method for a rewritable non-volatile memory module, wherein the rewritable non-volatile memory module comprises a plurality of physical units, and the voltage adjustment method comprises:

reading a first physical unit among the physical units based on a first read voltage to obtain a first count value, wherein the first count value reflects a total number of memory cells each having a threshold voltage lower than the first read voltage;

obtaining a second count value based on a difference between the first count value and a first default value;

bringing the second count value into a formula below to obtain a voltage adjustment parameter, $$\Delta R = (|\Delta CNT1|)/((|\Delta CNT1|)/a + b)$$

wherein ΔR represents the voltage adjustment parameter, ΔCNT1 represents the second count value, and a and b are constants;

adjusting the first read voltage to a second read voltage according to the voltage adjustment parameter; and reading the first physical unit based on the second read voltage.

2. The voltage adjustment method of claim 1, wherein the first default value is positively related to a total number of all bits stored in the first physical unit.

3. The voltage adjustment method of claim 2, wherein the first default value is ½ of the total number of the all bits.

4. The voltage adjustment method of claim 1, wherein the step of adjusting the first read voltage to the second read voltage according to the voltage adjustment parameter comprises:

in response to the second count value being greater than zero, subtracting the voltage adjustment parameter from the first read voltage to obtain the second read voltage; and in response to the second count value being less than zero, adding the voltage adjustment parameter to the first read voltage to obtain the second read voltage.

5. The voltage adjustment method of claim 1, further comprising:

determining whether the second count value is greater than a second default value;

in response to the second count value being greater than the second default value, using a first set of parameters to set a and b in the formula; and in response to the second count value not being greater than the second default value, using a second set of parameters to set a and b in the formula, wherein the first set of parameters is different from the second set of parameters.

6. The voltage adjustment method of claim 1, wherein the second read voltage is used in a reread operation for the first physical unit.

7. A memory storage device, comprising:

a connection interface unit, configured to connect to a host system;

a rewritable non-volatile memory module, comprising a plurality of physical units; and a memory control circuit unit, connected to the connection interface unit and the rewritable non-volatile memory module, wherein the memory control circuit unit is configured to:

read a first physical unit among the physical units based on a first read voltage to obtain a first count value, wherein the first count value reflects a total number of memory cells each having a threshold voltage lower than the first read voltage;

obtain a second count value based on a difference between the first count value and a first default value;

bring the second count value into a formula below to obtain a voltage adjustment parameter, $$\Delta R = (|\Delta CNT1|)/((|\Delta CNT1|)/a + b)$$

wherein ΔR represents the voltage adjustment parameter, ΔCNT1 represents the second count value, and a and b are constants;

adjust the first read voltage to a second read voltage according to the voltage adjustment parameter; and read the first physical unit based on the second read voltage.

8. The memory storage device of claim 7, wherein the first default value is positively related to a total number of all bits stored in the first physical unit.

9. The memory storage device of claim 8, wherein the first default value is ½ of the total number of the all bits.

10. The memory storage device of claim 7, wherein the operation of adjusting the first read voltage to the second read voltage according to the voltage adjustment parameter by the memory control circuit unit comprises:

in response to the second count value being greater than zero, subtracting the voltage adjustment parameter from the first read voltage to obtain the second read voltage; and in response to the second count value being less than zero, adding the voltage adjustment parameter to the first read voltage to obtain the second read voltage.

11. The memory storage device of claim 7, wherein the memory control circuit unit is further configured to:

determine whether the second count value is greater than a second default value;

in response to the second count value being greater than the second default value, use a first set of parameters to set a and b in the formula; and in response to the second count value not being greater than the second default value, use a second set of parameters to set a and b in the formula, wherein the first set of parameters is different from the second set of parameters.

12. The memory storage device of claim 7, wherein the second read voltage is used in a reread operation for the first physical unit.

13. A memory control circuit unit for controlling a rewritable non-volatile memory module, wherein the rewritable non-volatile memory module comprises a plurality of physical units, and the memory control circuit unit comprises:

a host interface, configured to connect to a host system;

a memory interface, configured to connect to the rewritable non-volatile memory module; and a memory management circuit, connected to the host interface and the memory interface, wherein the memory management circuit is configured to:

read a first physical unit among the physical units based on a first read voltage to obtain a first count value, wherein the first count value reflects a total number of memory cells each having a threshold voltage lower than the first read voltage;

obtain a second count value based on a difference between the first count value and a first default value;

bring the second count value into a formula below to obtain a voltage adjustment parameter, $$\Delta R = (|\Delta CNT1|)/((|\Delta CNT1|)/a + b)$$

wherein ΔR represents the voltage adjustment parameter, ΔCNT1 represents the second count value, and a and b are constants;

adjust the first read voltage to a second read voltage according to the voltage adjustment parameter; and read the first physical unit based on the second read voltage.

14. The memory control circuit unit of claim 13, wherein the first default value is positively related to a total number of all bits stored in the first physical unit.

15. The memory control circuit unit of claim 14, wherein the first default value is ½ of the total number of the all bits.

16. The memory control circuit unit of claim 13, wherein the operation of adjusting the first read voltage to the second read voltage according to the voltage adjustment parameter by the memory management circuit comprises:

in response to the second count value being greater than zero, subtracting the voltage adjustment parameter from the first read voltage to obtain the second read voltage; and in response to the second count value being less than zero, adding the voltage adjustment parameter to the first read voltage to obtain the second read voltage.

17. The memory control circuit unit of claim 13, wherein the memory management circuit is further configured to:

determine whether the second count value is greater than a second default value;

in response to the second count value being greater than the second default value, use a first set of parameters to set a and b in the formula; and in response to the second count value not being greater than the second default value, use a second set of parameters to set a and b in the formula, wherein the first set of parameters is different from the second set of parameters.

18. The memory control circuit unit of claim 13, wherein the second read voltage is used in a reread operation for the first physical unit.

* * * * *